United States Patent [19]
Rostoker et al.

[11] Patent Number: 5,457,878
[45] Date of Patent: Oct. 17, 1995

[54] METHOD FOR MOUNTING INTEGRATED CIRCUIT CHIPS ON A MINI-BOARD

[75] Inventors: Michael D. Rostoker, San Jose; Nicholas F. Pasch, Pacifica, both of Calif.

[73] Assignee: LSI Logic Corporation, Milpitas, Calif.

[21] Appl. No.: 135,777

[22] Filed: Oct. 12, 1993

[51] Int. Cl.$^6$ .................................................. H05K 3/30
[52] U.S. Cl. .......................... 29/840; 29/832; 29/841
[58] Field of Search ...................... 29/832, 840, 841; 228/180.21; 361/760, 777, 784, 790; 174/261

[56] References Cited

U.S. PATENT DOCUMENTS

| | | | |
|---|---|---|---|
| 2,985,709 | 5/1961 | Mammola | 361/777 |
| 4,004,726 | 1/1977 | Ellington, IV | 228/180.21 |
| 4,381,602 | 5/1983 | McIver | 29/832 |
| 4,734,753 | 3/1988 | Cranston et al. | 228/180.21 |
| 4,871,317 | 10/1989 | Jones | 361/760 |
| 5,166,865 | 11/1992 | Morrison et al. | 361/760 |
| 5,263,245 | 11/1993 | Patel et al. | 29/832 |
| 5,313,365 | 5/1994 | Pennisi et al. | 361/760 |

FOREIGN PATENT DOCUMENTS

| | | |
|---|---|---|
| 3705838 | 10/1987 | Germany. |
| 1117086 | 5/1989 | Japan ......................... 361/760 |

*Primary Examiner*—P. W. Echols

[57] ABSTRACT

An apparatus and method for mounting and connecting a plurality of integrated circuit chip dice to a printed circuit substrate by means of a small circuit board (such as a Mini-Board) that may be adapted to attach and connect into a plurality of different types of printed circuit board systems. A pattern of conductors that monotonically increases in pitch and width from a central point on a planar structure to the perimeter edge of the structure allows matching of any type of printed circuit board connections. A standard Mini-Board may be fabricated and tested before attaching to an electronic system printed circuit board. Repair and rework is easily facilitated with a minimum amount of damage to a printed circuit board by utilizing the present invention. A plurality of active and passive electronic components may also be attached and connected to the planar structure of the present invention. A hybrid mini-system may be fabricated and tested before connecting it into a system printed circuit board.

7 Claims, 9 Drawing Sheets

METHOD FOR MOUNTING INTEGRATED CIRCUIT CHIPS ON A MINI-BOARD

BACKGROUND OF THE INVENTION

1. Field of the Invention

This invention relates generally to mounting and connecting integrated circuit chip dice to a printed circuit substrate, and in particular, to an apparatus and method for mounting and connecting the chip dice to a Mini-Board that may be adapted to attach and connect into a plurality of different types of printed circuit board systems.

2. Description of the Related Technology

Packaging techniques for integrated circuits have been developed in the past in an attempt to satisfy demands for miniaturization in the semiconductor industry. Improved methods for miniaturization of integrated circuits enabling the integration of millions of transistor circuit elements into single integrated silicon embodied circuits, or chips, have resulted in increased emphasis on methods to package these circuits in space efficient, yet reliable and mass producible packages.

Integrated circuits are created from a silicon wafer using various etching, doping and depositing steps that are well known in the art of fabricating integrated circuit devices. A silicon wafer may be comprised of a number of integrated circuit dice that each represent a single integrated circuit chip die. Ultimately, the chip may be packaged by transfer molding plastic encasement around the die with a variety of pin-out or mounting and interconnection schemes, or the die may be directly attached and connected to a printed circuit board substrate.

Directly mounting integrated circuit chip dice onto printed circuit boards, commonly called Chip-On-Board (COB), and the connection of the chip dice to the printed circuit board substrate conductors by using direct wire bonding, create significant technological problems for the electronic system manufacturer. As the chip densities and sophistication of circuitry contained therein became greater, the precision required in mounting and connecting the chip die to the printed circuit board substrate and conductors become critical.

Mounting precision is important because resolution of the circuit conductor traces on the printed circuit board have to properly align with the integrated circuit chip die connection pads. The chip die pads would then be electrically connected to the printed circuit board conductors by means well known in the art such as, for example, wire bonding.

The mounting precision required and dimensional tolerances, however, are not easily achieved in a typical electronic systems manufacturing environment. The equipment required for COB fabrication for very fine tolerances is often beyond the means of most companies.

Another disadvantage of using COB for fabricating electronic systems is when there is a defective integrated circuit chip connected on the printed circuit board substrate. The printed circuit board often is damaged during service, and replacement of a new integrated circuit chip becomes extremely difficult during rework, even when proper equipment is available.

What is needed is a method and apparatus that allows mounting a plurality of integrated circuit chip dice to printed circuit boards having various levels of complexity and sophistication, ease in testing, and a relatively easy way of repairing or replacing a defective die.

SUMMARY OF THE INVENTION

The present invention allows an integrated circuit chip die or dice to be easily mounted onto a printed circuit board substrate. The present invention accomplishes this by mounting the chip die onto a planar substrate of small size relative to the printed circuit board of the electronic system. The use of the small planar substrate has many advantages over direct mounted COB technology as will be more fully described hereinafter.

A small circuit board (hereinafter a "Mini-Board") or other small assembly device (usually made of fiberglass or other traditional circuit board materials; or which may be made of ceramics, glass, silicon or other rigid materials; or which may be made of mylar or other stiffened flexible materials) may be utilized to mount one or more integrated circuit chip die face up, face down or a combination of both. The chip dice may be mounted on one side of the Mini-Board or on both sides. Conventional wire bonding or tape automated bonding (TAB) may be utilized to electrically connect the conductors of the Mini-Board to a face up integrated circuit chip die having exposed connection pads. Solder bump attachment technology may be utilized to attach a face down chip to the Mini-Board conductors.

An object of the present invention is to more easily attach integrated circuit dice to conventional printed circuit boards having a coarser conductor pattern than the integrated circuit chip die connection pads.

Another object is an apparatus and method to more easily test integrated circuit assemblies before integrating them into the printed circuit board of a finished product.

Still another object is an apparatus and method to more easily test integrated circuit assemblies after integrating them into the printed circuit board of a finished product.

A further object of the invention is to adjust the pitch of the Mini-Board interconnections so as to match the conductor pitch of a system circuit board with the more narrow connection pads of the integrated circuit chip die.

Still another object is the ability to more easily replace a defective integrated circuit chip die without substantially damaging the system printed circuit board during rework.

Yet another object of the present invention is to fabricate a standard product that may be adapted to fit different type and size printed circuit boards by trimming the perimeter edges of the Mini-Board.

The present invention accomplishes these objects, in addition to other objects that will be described in the drawings and detailed specification below.

The present invention comprises a planar structure for holding one or more integrated circuit chip dice. The planar structure may have attachment points for a die on one or both of its surfaces. The planar structure may have a set of attachment points for attaching it to a printed circuit board. The planar structure may connect to the integrated circuit connection pads by means of wire bonding, tape automated bonding, or other means known to those skilled in the art of integrated circuit chip die fabrication.

The planar structure may be electrically connected to the printed circuit board by means of wire bonding, solder bump attachment, or other means known to those skilled in the art of printed circuit board fabrication. The planar structure may be mechanically attached to the printed circuit board substrate by means of thermosetting resins, solder bump attachment, mechanical fasteners or other suitable means.

The present invention may also utilize a plurality of conductors on both sides of the planar surface with interconnections therebetween. These interconnections may be utilized for connecting one or more integrated circuit dice on one side of the planar structure with the printed circuit board connections on the other side of the planar structure. Additionally, integrated circuit dice may be attached to both sides of the planar structure and interconnections made therebetween.

The present invention utilizes tapered contact pads that may be utilized to adjust the pitch of the Mini-Board conductors, or contact pads, and the printed circuit board substrate connections. The Mini-Board contact pads may be, for example, radially symmetric with reference to some point on the Mini-Board. Implementations of the present invention may also be made that do not have contact pads that are radially symmetric.

A preferred embodiment of the present invention utilizes a Mini-Board having radially symmetric contact pads whose width increases monotonically as the contact pad radius increases from the center of the integrated circuit chip die. The pads are widest at the edge or perimeter of the Mini-Board.

The present invention matches the resolution capabilities of the conductors of a printed circuit board by preferably cutting the perimeter edges of the Mini-Board in order to match the appropriate size of the printed circuit board. The larger the Mini-Board is left after cutting, the larger its pads and the larger the pad pitch. Conversely, for a finer pitch printed circuit board conductors, the Mini-Board may be cut to a suitably smaller size, with its pad width and pitch proportionately reduced. Thus, the present invention may be utilized for printed circuit boards from modest printed circuit board manufacturing capabilities to the most sophisticated types of printed circuit board systems.

The smaller the Mini-Board of the present invention is trimmed, the less space it takes up on a system printed circuit board. One standard size of Mini-Board may be manufactured and tested. This standard size Mini-Board may then be trimmed to an appropriate size for a specific application. Furthermore, if the application changes or the printed circuit board complexity increases or a finer pitch is used, the same standard Mini-Board may be utilized by just trimming it smaller to match its new application.

The present invention may comprise a planar structure having conductors on one or both surfaces. The conductors may be interconnected as by means of through-hole connections from one side of the planar structure to the other, or by other suitable means. Multi-level interconnections within the structure may be utilized as those skilled in the art of printed circuit board fabrication may readily appreciate.

The present invention may contain one or more integrated circuit chip dice, active semiconductor electronic components, passive electronic components, other types of devices (such as heat sinks, packaged chips, display devices, etc.) or any combination thereof. Different types of integrated circuit chip dice and/or other devices or components may be interconnected to form a highly integrated mini-system. Active components such as, for example, bipolar transistors, field effect transistors, etc., and passive components such as, for example, diodes, resistors, capacitors, inductors, and metal oxide varistors may be added to the planar substrate together, or in combination with integrated circuit dice, to produce a highly integrated and sophisticated hybrid mini-system. This is important for signal level interfacing, bypassing for noise, and protecting the delicate circuitry of the integrated circuit(s) from transients.

The Mini-Board of the present invention may be mounted to a printed circuit board substrate in a number of ways. The Mini-Board may be mounted with the integrated circuit die up or down, and with the back of the die exposed or hidden. This flexibility of mounting the Mini-Board and die allows a variety of passivation and cooling alternatives. The tapered pad structure of the Mini-Board may be on either the top or bottom as is most appropriate for the mounting configuration desired.

After the integrated circuit chip dice and any active or passive or other devices or components are attached to the Mini-Board, the Mini-Board system may be tested for proper operation. After testing, the present invention may be mechanically protected from environmental and mechanical damage. This protection may include, but is not limited to, the following: a "tuna can" lid similar to an M-Quad integrated circuit package; epoxy coating on only the chip die that seals the back and edges of the die; epoxy coating of the entire Mini-Board before mounting onto the printed circuit board; epoxy coating of the entire Mini-Board or hermetically sealing the die or board after mounting to the printed circuit board. Such encapsulation may be hermetic, as illustrated in U.S. patent application Ser. No. 07/985,984, entitled "Method and Apparatus for Hermetically Encapsulating an Integrated Circuit" by Michael Rostoker, filed Dec. 4, 1992, and which is herein incorporated by reference. In addition, polymer materials may be used to protect the exposed die and associated components as mentioned above. Multiple polymer coatings may be applied such as, for example, a flexible polymer coating over the chip die and components, and a rigid polymer coating over the flexible one, for all of the above mentioned forms of protection.

The present invention may be readily adapted for attaching or mounting means for cooling the integrated circuit chip dice and/or active or passive components. Adhesive coatings may be appropriately applied to facilitate the mounting or attaching of cooling means such as, for example, heat sinks, radiator fins, cooling pipes, and other means well known to those skilled in the art of removing heat from electronic components, assemblies and systems. In addition, shielding may be applied to the Mini-Board and the components therein for electrostatic or electromagnetic interference reduction.

A feature of the present invention is a planar structure that holds a plurality of integrated circuit dice.

Another feature is a planar structure that contains a plurality of integrated circuit dice, active or passive electronic or other components, and means for interconnection therebetween.

Still a further feature of the present invention is attachment points for an integrated circuit die on one face of the planar structure.

Another feature is attachment points on the planar structure for attachment to a printed circuit board substrate.

Yet another feature is attaching the present invention to a printed circuit board by means of wire bonding.

Still another feature is attaching the present invention to a printed circuit board by means of solder bumps.

Another feature is attaching the present invention to a printed circuit board by means of thermosetting or other resins.

Still another feature is a planar structure that has a set of interconnection from the perimeter of the integrated circuit chip die to the perimeter of the Mini-Board.

A feature of the present invention is adjusting the conductor pitch of the interconnections between the integrated circuit chip die on the Mini-Board to the printed circuit board substrate conductor pitch.

Another feature of the present invention is adjusting the conductor width of the interconnections between the integrated circuit chip die on the Mini-Board to the printed circuit board substrate conductor width.

Still a further feature is encapsulating the integrated circuit chip die for protection from environmental and mechanical damage.

Yet a further feature is encapsulating the integrated circuit chip die in epoxy or polymer materials for protection from environmental and mechanical damage.

A further feature is encapsulating the integrated circuit chip die and planar structure for protection from environmental and mechanical damage.

Another feature is encapsulating the integrated circuit chip die and planar structure in epoxy or polymer materials for protection from environmental and mechanical damage.

A further feature of the present invention is adaptation for attachment of a means for cooling the electronic devices contained on the Mini-Board.

An advantage of the present invention is ease in adapting to fit a plurality of different types of printed circuit board conductor pitch and widths.

Another advantage is ease in testing the circuitry contained on the Mini-Board before encapsulation or attachment to a electronic system printed circuit board substrate.

Yet another advantage of the present invention is repair of defective components without substantially damaging the system printed circuit board substrate.

Still a further advantage of the present invention is to mix and match active and passive and/or other electronic components onto a Mini-Board and make connections therebetween, test the connected components and encapsulate some or all of them in a standard form that may be readily adapted to match the conductor pad pitch and width of various sizes and types of printed circuit boards.

Other and further objects, features and advantages will be apparent from the following description of a presently preferred embodiment of the invention, given for the purpose of disclosure and taken in conjunction with the accompanying drawings.

DETAILED DESCRIPTION OF THE PREFERRED EMBODIMENTS

Figure 1:
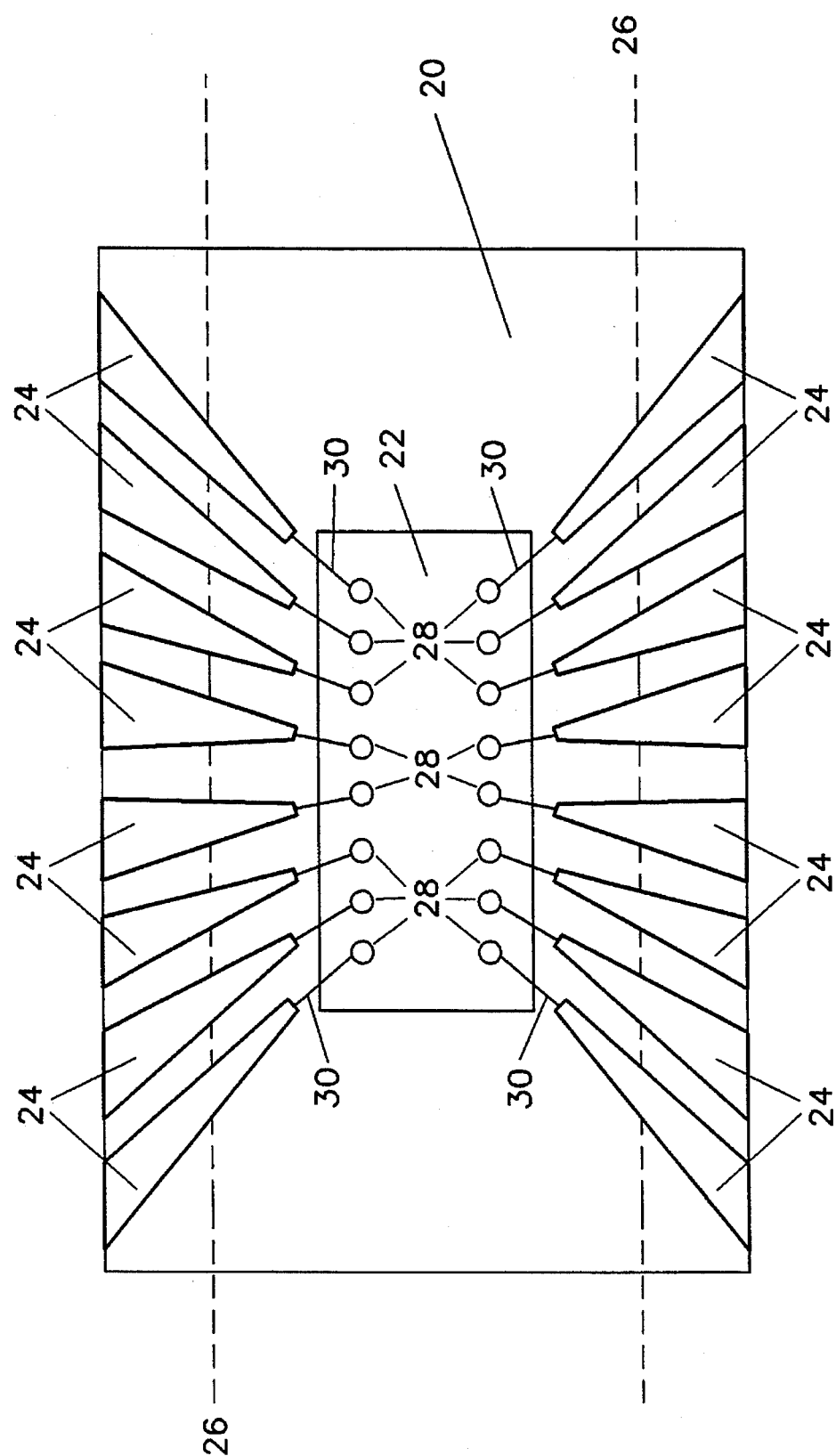
FIG. 1 is a schematic plan view of an embodiment of the present invention.

The present invention allows an integrated circuit chip die or dice to be easily mounted onto a printed circuit board substrate. The present invention accomplishes this by mounting the chip onto a planar substrate of small size relative to the printed circuit board of the electronic system. Referring now to the drawings, the details of the preferred embodiments are schematically illustrated. Like elements will be referred to with like numbers and similar elements will be referred to with like numbers and a different lower case letter suffix.

FIG. 1 is a schematic plan view of an embodiment of the present invention. A planar structure 20, or small circuit board (such as a Mini-Board), has an integrated circuit chip die 22 attached to one of its surfaces. Tapered contact pads 24 are attached to the planar structure 20. The width of the tapered contact pads 24 are narrower near the integrated circuit chip die 22 than at the outer perimeter of the planar structure 20. The tapered contact pads 24 may increase in width monotonically from the integrated circuit chip die 22 to the perimeter edge of the planar structure 20.

This monotonic increase in tapered contact pad 24 width is a new, novel and nonobvious feature of the present invention because the perimeter of the planar structure 20 may be cut to any shape or size in order to accommodate a particular printed circuit board technology. An illustrative cut is represented by dashed line 26. The closer the planar structure 20 is cut to the integrated circuit chip die 22, the finer will be the tapered contact pad 24 pitch and width. In addition, the closer the cut is made, the smaller is the overall planar structure 20 dimensions. Preferably, the finer pitch and width of the circuit conductors of a printed circuit board, the smaller are the components.

The integrated circuit chip die 22 has integrated circuit connection pads 28 which may be connected to the tapered contact pads 24 by means of wire bonding, tape automated bonding, flip-chip, solder-bump or other means of connecting to integrated circuit chips well known to those skilled in the art. The integrated circuit chip die 22 may be attached to the planar structure 20 by means of adhesive such as, for example, epoxy (not illustrated).

Figure 2:
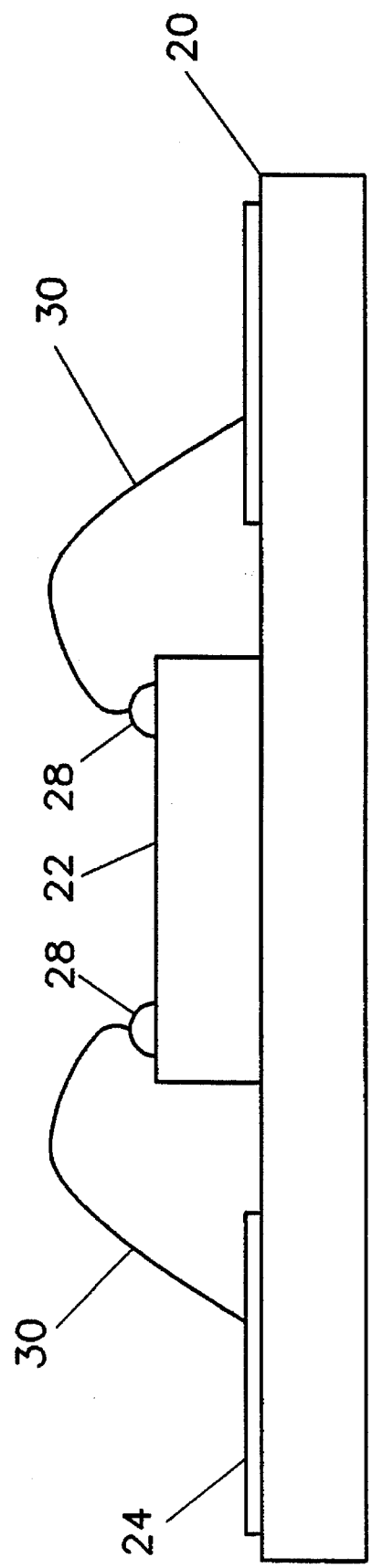
FIG. 2 is a schematic elevational view of the present invention illustrating wire bonding of the integrated circuit chip die connections to the Mini-Board conductors.
Figure 3:
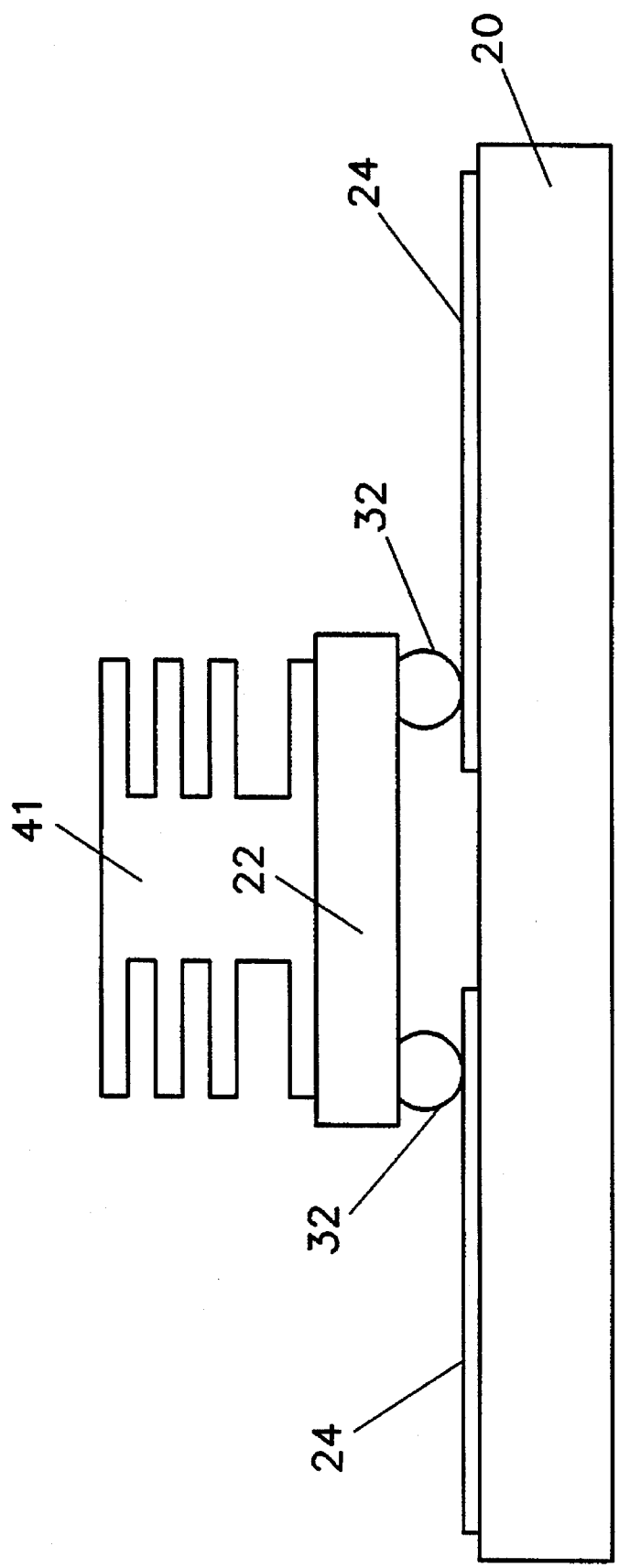
FIG. 3 is a schematic elevational view of the present invention illustrating solder bump connections of the integrated circuit chip die to the Mini-Board conductors.

Referring to FIG. 2, a schematic elevational view of the embodiment of FIG. 1 is illustrated. Integrated circuit chip die 22 is attached to the planar structure 20 face up and bond wires 30 connect the integrated circuit connection pads 28 to the tapered contact pads 24 of planar structure 20. Referring to FIG. 3, a schematic elevational view of an alternate embodiment of FIG. 1 is illustrated. Integrated circuit chip die 22 is attached to the planar structure 20 face down by means of solder bumps 32 that both mechanically and electrically connect the integrated circuit chip die 22 to the planar structure 20 and tapered contact pads 24, respectively. A heat dissipating device (heat sink) 41 may be mounted to the surface of the integrated circuit chip die 22 for dissipation of heat therefrom.

Figure 4:
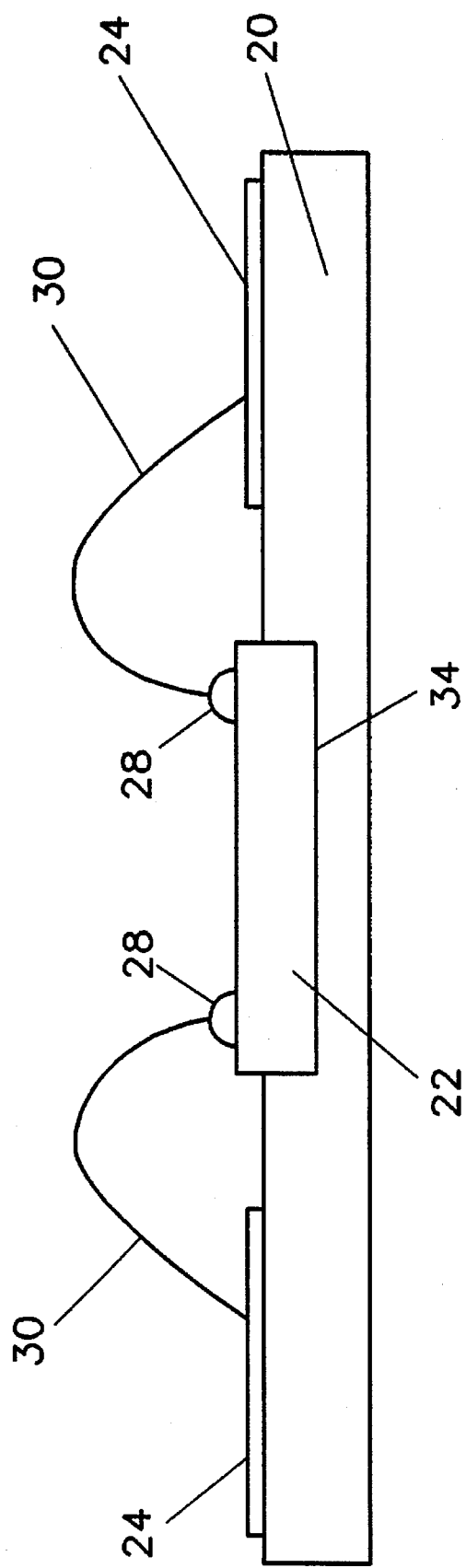
FIG. 4 is a schematic elevational view of another embodiment of the present invention.

Referring to FIG. 4, a schematic elevational view of yet another alternate embodiment of FIG. 1 is illustrated. The integrated circuit chip die 22 is recessed into well 34 and attached to the planar structure 20. Connection is made between integrated circuit connection pads 28 and tapered contact pads 24 by bond wires 30.

Figure 5:
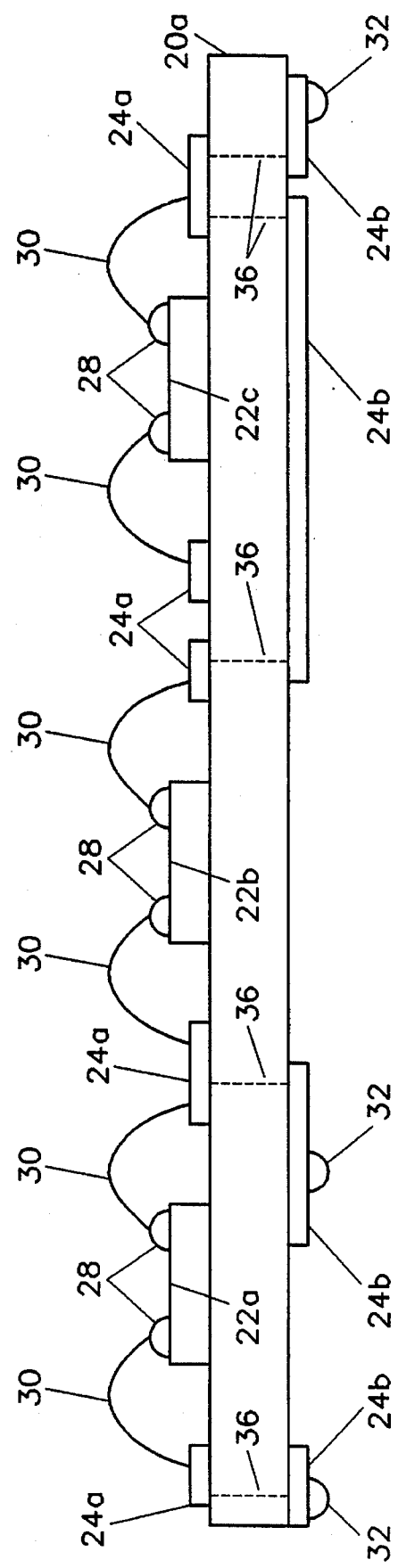
FIG. 5 is a schematic elevational view of the present invention having a plurality of integrated circuit chip dice attached and connected on both surfaces of the planar structure.

Referring now to FIG. 5, a schematic elevational view of an embodiment having a plurality of integrated circuit chip dice is illustrated. Integrated circuit chip dice 22a, 22b and 22c are attached as mentioned above to one surface of planar structure 20b. Integrated circuit connection pads 28 for integrated circuit chip dice 22a, 22b and 22c are connected to tapered contact pads 24a by bond wires 30. Tapered contact pads 24b are on the other surface of the planar structure 20b and are used to connect to solder bumps 32 and for interconnections between tapered contact pads 24a and 24b as by means of through hole connections 36. Hole connections 36 interconnect between the tapered contact pads 24a and 24b on both surfaces of the planar structure 20b. The solder bumps 32 are used to attach and connect the planar structure 20b to a printed circuit board (not illustrated).

Figure 6:
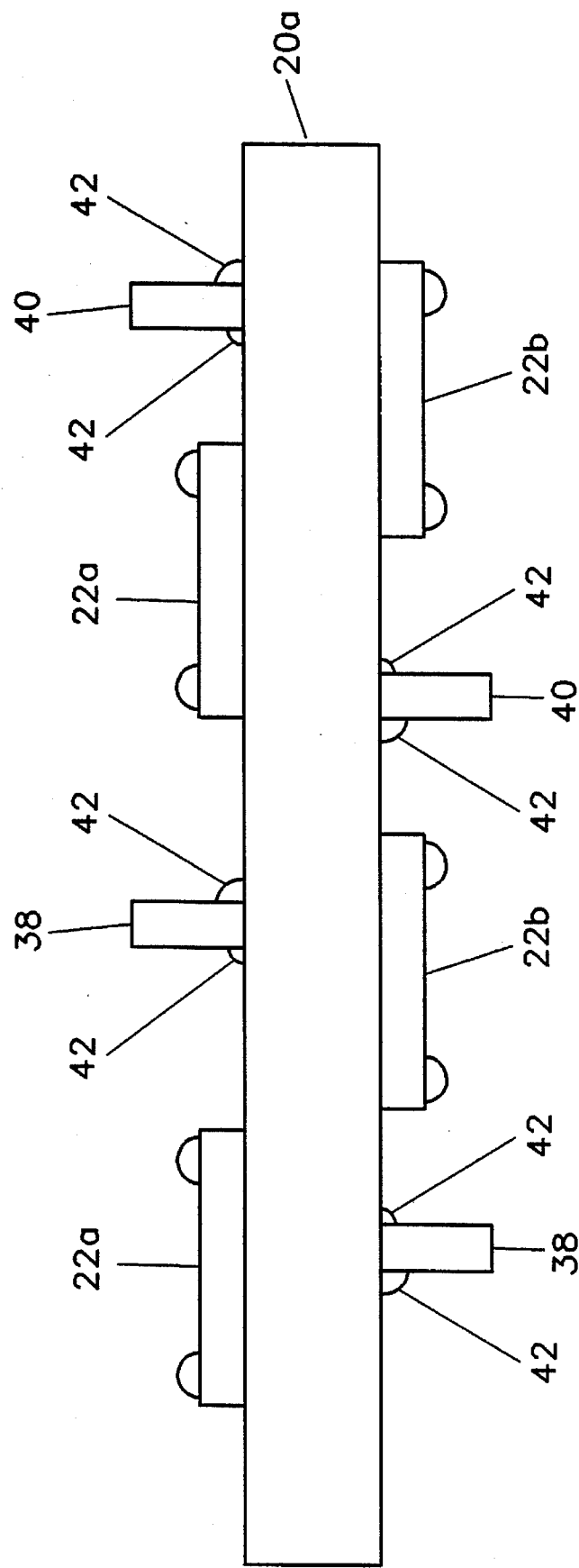
FIG. 6 is a schematic elevational view of a plurality of chip dice, and active and passive components attached to both surfaces of the planar structure.

Referring now to FIG. 6, a schematic elevational view of an embodiment having a plurality of integrated circuit chip dice and active and/or passive electronic and/or other components is illustrated. Planar structure 20c has attached thereto chip dice 22a and 22b on both surfaces. In addition, active electronic component transistor 38 and passive electronic component capacitor 40 are mounted to the top surface of planar structure 20c. The embodiment illustrated in FIG. 6 is a hybrid circuit which may contain different integrated circuit chip dice and various support circuits and/or other components which comprise a complete subsystem on a small circuit board (such as a Mini-Board). Attachment of this hybrid subsystem on a Mini-Board to a system printed circuit board substrate may be accomplished in any reasonable manner, such as the same manner as illustrated and described with respect to FIG. 5.

Figure 7:
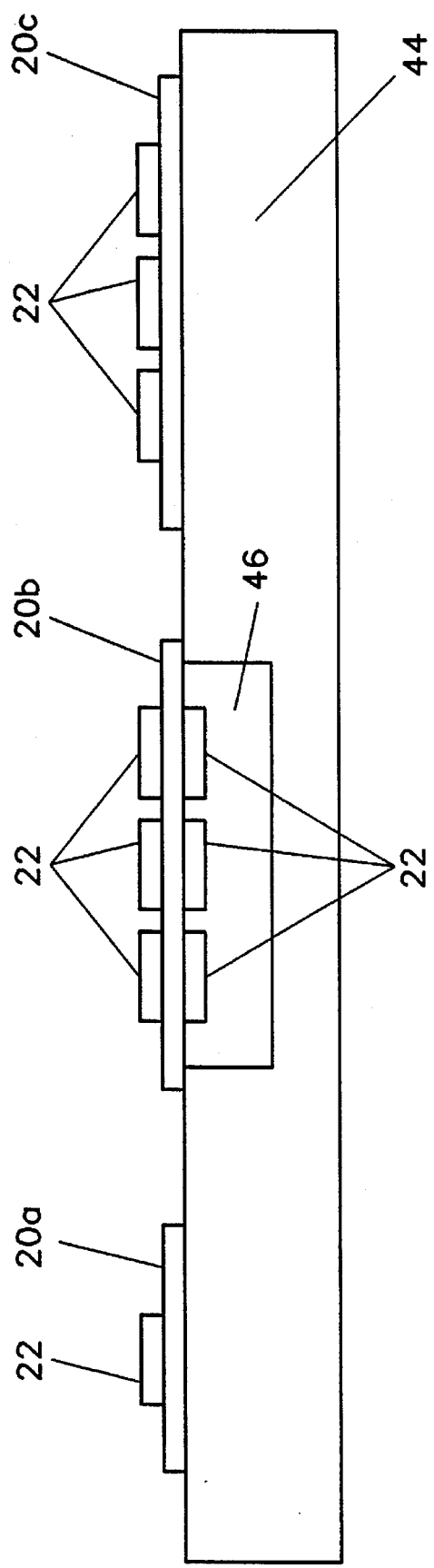
FIG. 7 is a schematic elevational view of a plurality of the present invention mounted onto a system printed circuit board substrate.

Referring now to FIG. 7, a plurality of Mini-Boards of the present invention mounted onto a system printed circuit board is illustrated in schematic elevational view. Planar structures 20a (of the type illustrated in FIGS. 2–4), 20b and 20c are attached to a printed circuit board substrate 44. Other combinations of planar structures or Mini-Boards of the present invention may be mounted. Planar structure 20c is mounted over a recess or well 46 in the printed circuit board substrate 44. The planar structures may be manufactured in a standard size board configuration and trimmed to match up with different types of printed circuit board connection pitch and width.

Figure 8:
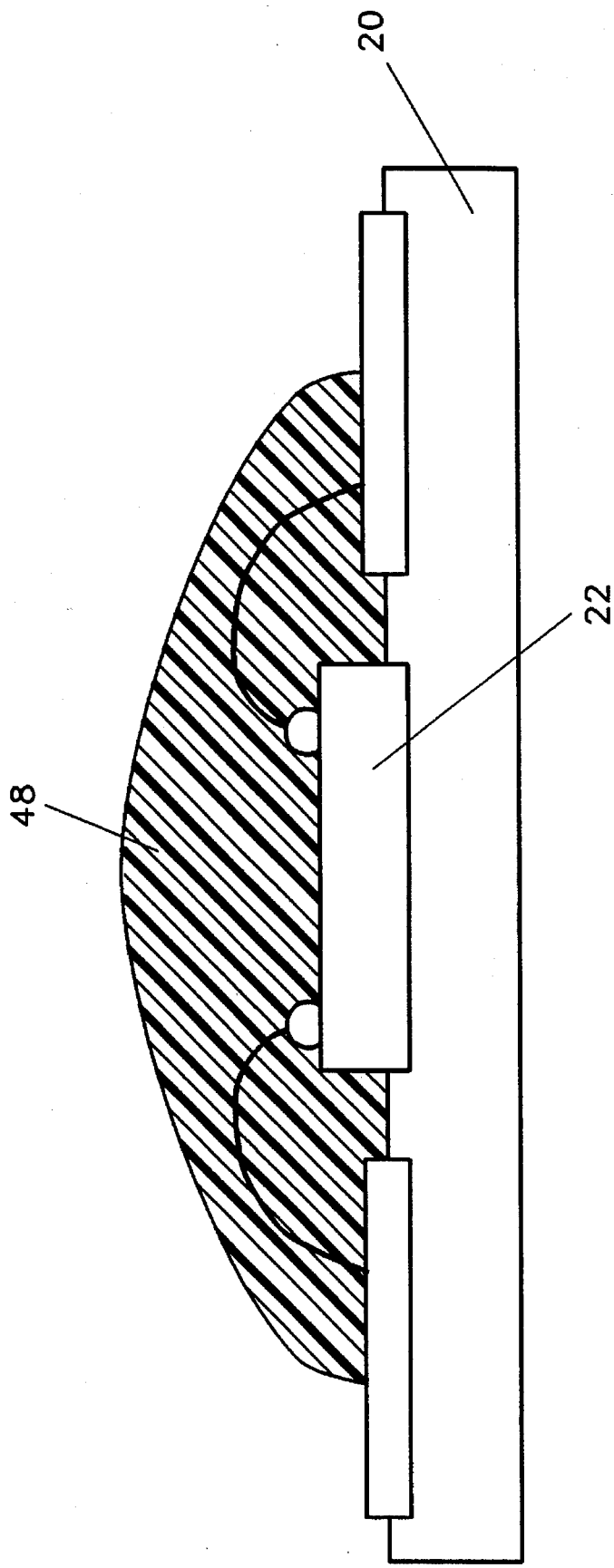
FIGS. 8 and 9 are schematic elevational views of encapsulating means for the present invention.
Figure 9:
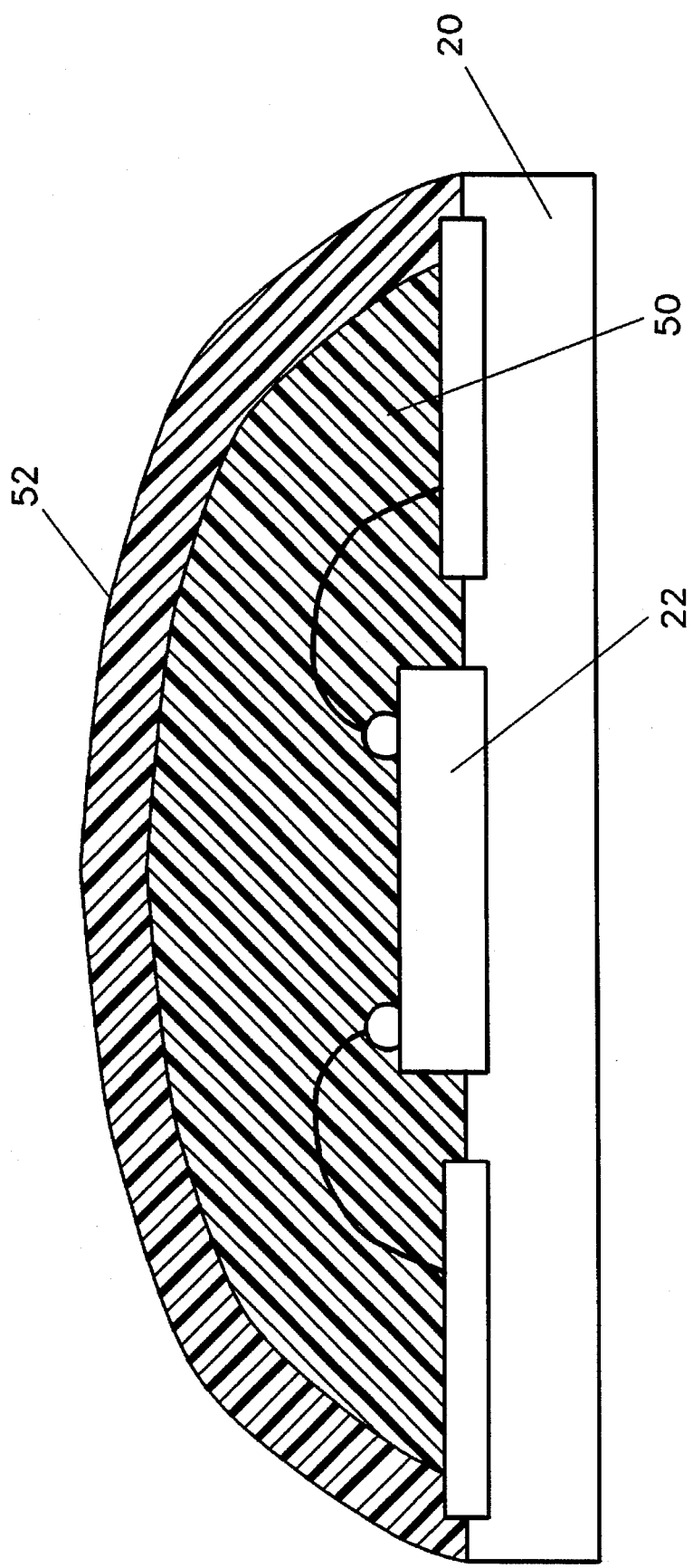

The present invention may be encapsulated for protection from environmental and mechanical damage by coating it with epoxy or polymer materials or other sealant materials. Referring now to FIGS. 8 and 9, preferred embodiments of coatings for the present invention are illustrated in schematic elevational views. An epoxy or polymer coating 48 may be applied over the integrated circuit chip die 22 or may be applied over the entire planar structure 20 face. As illustrated in FIG. 9, a soft polymer coating 50 may be applied over the integrated circuit chip die 22 and planar structure 20, then a hard polymer coating 52 may be applied thereover. Various other means of coating the present invention are well known to one skilled in the art of electronic packaging.

The apparatus and method of the present invention, therefore, is well adapted to carry out the objects and attain the ends and advantages mentioned, as well as others inherent therein. While presently preferred embodiments of the invention have been given for purposes of disclosure, numerous changes in the details of construction, interconnection and arrangement of parts will readily suggest themselves to those skilled in the art, and which are encompassed within the spirit of the invention and the scope of the appended claims.

What is claimed is:

1. A method for mounting and connecting an integrated circuit chip die having connection pads thereon to a variety of circuit boards having different conductor pitches and widths thereon, comprising the steps of:

connecting an integrated circuit chip die to a planar structure having radially symmetric contact pads whose width increases monotonically as the contact pad radius increases from the center of the integrated circuit chip die;

trimming the outer edges of the planar structure so that the planar structure contact pads substantially match the pitch and width of the conductors on the circuit board; and connecting the planar structure conductor pads to the printed circuit board conductors.

2. The method of claim 1, further comprising the step of connecting a plurality of integrated circuit chip dice to the planar structure.

3. The method of claim 1, further comprising the step of connecting a plurality of passive and active electronic components to the planar structure.

4. The method of claim 1, further comprising the step of attaching the integrated circuit chip die to the planar structure.

5. The method of claim 1, further comprising the step of attaching the planar structure to the printed circuit board.

6. The method of claim 1, further comprising the step of encapsulating the integrated circuit chip die.

7. The method of claim 1, further comprising the step of encapsulating the integrated circuit chip die and encapsulating the planar structure.

* * * * *